(12) United States Patent
Yasuda

(10) Patent No.: US 10,924,084 B2
(45) Date of Patent: Feb. 16, 2021

(54) ACOUSTIC WAVE DEVICE, DUPLEXER, AND FILTER DEVICE

(71) Applicant: Murata Manufacturing Co., Ltd., Nagaokakyo (JP)

(72) Inventor: Junpei Yasuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 16/527,082

(22) Filed: Jul. 31, 2019

(65) Prior Publication Data

US 2019/0356302 A1 Nov. 21, 2019

Related U.S. Application Data

(63) Continuation of application No. PCT/JP2017/045716, filed on Dec. 20, 2017.

(30) Foreign Application Priority Data

Feb. 6, 2017 (JP) .................. 2017-019660

(51) Int. Cl.
| | |
|---|---|
| *H03H 9/64* | (2006.01) |
| *H03H 9/72* | (2006.01) |
| *H03H 9/205* | (2006.01) |
| *H03H 9/13* | (2006.01) |
| *H03H 9/60* | (2006.01) |
| *H03H 9/70* | (2006.01) |

(52) U.S. Cl.
CPC .............. *H03H 9/205* (2013.01); *H03H 9/13* (2013.01); *H03H 9/605* (2013.01); *H03H 9/70* (2013.01)

(58) Field of Classification Search
CPC .............. H03H 9/54; H03H 9/64; H03H 9/972
See application file for complete search history.

(56) References Cited

U.S. PATENT DOCUMENTS

| | | | |
|---|---|---|---|
| 10,644,674 B2 * | 5/2020 | Takamine | ......... H03H 9/02992 |
| 2003/0117039 A1 | 6/2003 | Tsutsumi et al. | |
| 2005/0025324 A1 | 2/2005 | Takata | |
| 2013/0257562 A1 | 10/2013 | Schmidhammer | |
| 2018/0097508 A1 | 4/2018 | Iwamoto et al. | |

FOREIGN PATENT DOCUMENTS

| | | |
|---|---|---|
| JP | 2003-188681 A | 7/2003 |
| JP | 2005-045475 A | 2/2005 |
| JP | 2012-147175 A | 8/2012 |
| JP | 2013-539308 A | 10/2013 |
| WO | 2016/208446 A1 | 12/2016 |

OTHER PUBLICATIONS

Official Communication issued in International Patent Application No. PCT/JP2017/045716 dated Mar. 6, 2018.

* cited by examiner

*Primary Examiner* — Dean O Takaoka
(74) *Attorney, Agent, or Firm* — Keating & Bennett, LLP

(57) ABSTRACT

An acoustic wave device includes an antenna terminal, a signal terminal, and a plurality of resonators that are provided on a piezoelectric substrate. The plurality of resonators include a plurality of series arm resonators on a series arm, and the duty of an IDT electrode of the series arm resonator closest to the antenna terminal among the plurality of series arm resonators is smaller than the duty of an IDT electrode of at least one series arm resonator among the other series arm resonators.

17 Claims, 5 Drawing Sheets

ACOUSTIC WAVE DEVICE, DUPLEXER, AND FILTER DEVICE

CROSS REFERENCE TO RELATED APPLICATIONS

This application claims the benefit of priority to Japanese Patent Application No. 2017-019660 filed on Feb. 6, 2017 and is a Continuation Application of PCT Application No. PCT/JP2017/045716 filed on Dec. 20, 2017. The entire contents of each application are hereby incorporated herein by reference.

BACKGROUND OF THE INVENTION

1. Field of the Invention

The present invention relates to an acoustic wave device in which a plurality of resonators are provided on a series arm, and a duplexer and a filter device including the acoustic wave device.

2. Description of the Related Art

Hitherto, a duplexer using an acoustic wave filter has been widely used. An acoustic wave filter is a nonlinear device. Thus, there has been a problem in that intermodulation distortion (IMD) is likely to occur in a duplexer using an acoustic wave filter. In a duplexer described in Japanese Unexamined Patent Application Publication No. 2012-147175, a capacitor is connected in parallel with the parallel arm resonator closest to an antenna terminal in a transmitting filter. By connecting the capacitor in parallel, the resonant frequency of the parallel arm resonator closest to the antenna terminal is increased. As a result, the resonant frequency is positioned near the top end of the 2Tx-Rx band. Thus, the return loss of the parallel arm resonator having an increased resonant frequency is reduced, thereby suppressing the occurrence of IMD. According to Japanese Unexamined Patent Application Publication No. 2012-147175, miniaturization is able to be facilitated compared with a technique in which an interdigital transducer (IDT) electrode of a parallel arm resonator or a series arm resonator has a divided configuration.

In the duplexer described in Japanese Unexamined Patent Application Publication No. 2012-147175, the capacitor is connected in parallel with the parallel arm resonator closest to the antenna terminal in the transmitting filter. The capacitor needs to be configured, and thus the facilitation of further miniaturization has been difficult. In addition, the capacitor needs to be configured in addition to the parallel arm resonator.

SUMMARY OF THE INVENTION

Preferred embodiments of the present invention provide acoustic wave devices that are each able to significantly reduce or prevent an occurrence of IMD and that are able to facilitate further miniaturization.

Preferred embodiments of the present invention also provide duplexers and filter devices including an acoustic wave device that are each able to significantly reduce or prevent an occurrence of IMD and that are each able to facilitate further miniaturization.

An acoustic wave device according to a preferred embodiment of the present invention includes a piezoelectric substrate, an antenna terminal that is provided on the piezoelectric substrate and that is electrically connected to an antenna, a signal terminal that is provided on the piezoelectric substrate, to which a signal is input, and from which a signal is output, and a plurality of resonators that are provided on the piezoelectric substrate and that include an IDT electrode, and the plurality of resonators include a plurality of series arm resonators on a series arm electrically connecting the antenna terminal to the signal terminal, and a duty of the IDT electrode of a series arm resonator closest to the antenna terminal among the plurality of series arm resonators is smaller than a duty of the IDT electrode of at least one series arm resonator among the other series arm resonators.

In an acoustic wave device according to a preferred embodiment of the present invention, the duty of the IDT electrode of the series arm resonator closest to the antenna terminal is the smallest among the duties of the IDT electrodes of the plurality of series arm resonators. In this case, the occurrence of IMD is able to be further significantly reduced or prevented.

In an acoustic wave device according to a preferred embodiment of the present invention, the other series arm resonators include a series arm resonator with a lower resonant frequency than the series arm resonator closest to the antenna terminal. In this case, an increase in insertion loss in a pass band is able to be significantly reduced or prevented and the steepness of filter characteristic is able to be maintained.

In an acoustic wave device according to a preferred embodiment of the present invention, among the plurality of series arm resonators, the duty of the IDT electrode of a series arm resonator whose size along an acoustic-wave propagation direction is relatively large is greater than the duty of the IDT electrode of a series arm resonator whose size along the acoustic-wave propagation direction is relatively small. In this case, the acoustic wave device is able to be further reduced in size.

In an acoustic wave device according to a preferred embodiment of the present invention, the duty of the IDT electrode of a series arm resonator whose size along an acoustic-wave propagation direction is the largest among the plurality of series arm resonators is the largest among the duties of the IDT electrodes of all the resonators. In this case, the acoustic wave device is able to be further reduced in size.

In an acoustic wave device according to a preferred embodiment of the present invention, a resonator closest to the antenna terminal among the plurality of resonators is the series arm resonator closest to the antenna terminal. In this case, the occurrence of IMD is able to be further significantly reduced or prevented.

In an acoustic wave device according to a preferred embodiment of the present invention, the plurality of resonators include the plurality of series arm resonators and a plurality of parallel arm resonators electrically connected between the series arm and the ground potential, and a ladder filter is provided.

In an acoustic wave device according to a preferred embodiment of the present invention, the plurality of resonators include the plurality of series arm resonators and a longitudinally coupled resonator type acoustic wave filter provided on the series arm.

In an acoustic wave device according to a preferred embodiment of the present invention, the signal terminal is a receiving terminal and a receiving filter.

A duplexer according to a preferred embodiment of the present invention includes a first band-pass filter, and a second band-pass filter, which is electrically connected to the first band-pass filter and the antenna terminal to define a common connection, and at least one of the first band-pass filter and the second band-pass filter includes an acoustic wave device in accordance with a preferred embodiment of the present invention.

A filter device according to a preferred embodiment of the present invention includes a first band-pass filter including an acoustic wave device in accordance with a preferred embodiment of the present invention, and at least one band-pass filter that is electrically connected to the antenna terminal to define a common connection. In this case, the occurrence of IMD is able to be significantly reduced or prevented in accordance with the preferred embodiments of the present invention, and a small filter device suitable for carrier aggregation (CA) is able to be provided.

With acoustic wave devices, duplexers, and filter devices according to preferred embodiments of the present invention, the occurrence of IMD is able to be significantly reduced or prevented, and further miniaturization is able to be provided.

The above and other elements, features, steps, characteristics and advantages of the preferred embodiments of the present invention will become more apparent from the following detailed description of the preferred embodiments with reference to the attached drawings.

DETAILED DESCRIPTION OF THE PREFERRED EMBODIMENTS

In the following, preferred embodiments of the present invention will be described in detail with reference to the drawings.

It is to be noted that preferred embodiments described herein are examples and, among different preferred embodiments, features and/or elements of one preferred embodiment may be partially replaced or combined with features and/or elements of another preferred embodiment.

Figure 1:
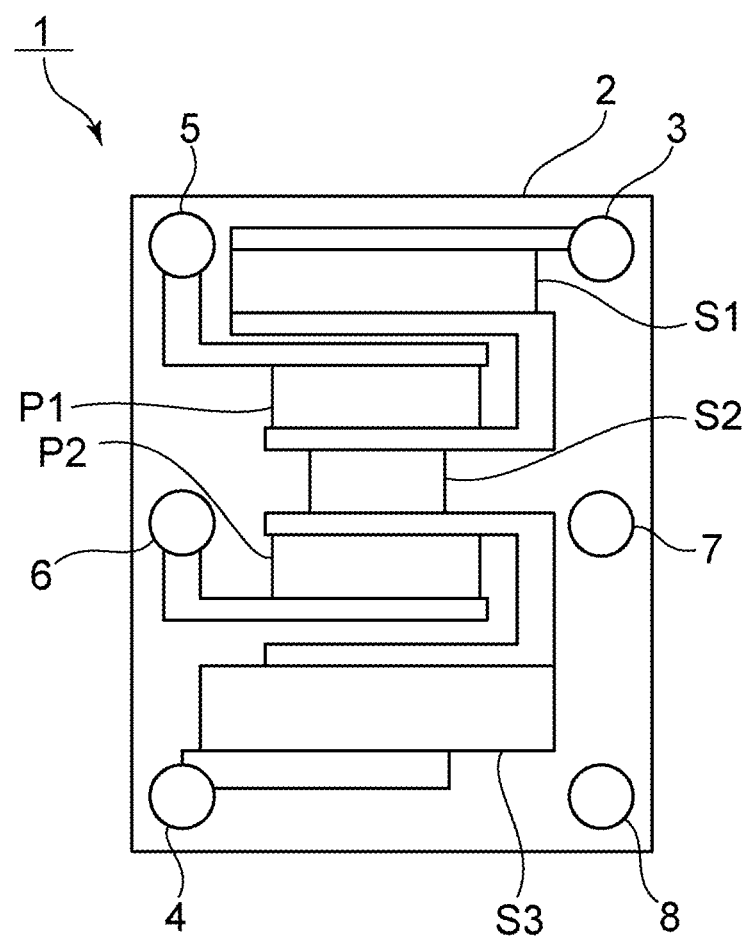
FIG. 1 is a plan view illustrating an electrode of an acoustic wave device according to a first preferred embodiment of the present invention.

FIG. 1 is a plan view illustrating an electrode of an acoustic wave device according to a first preferred embodiment of the present invention. An acoustic wave device 1 includes a piezoelectric substrate 2. The piezoelectric substrate 2 is preferably a piezoelectric single crystal, for example, $LiTaO_3$ or $LiNbO_3$. The piezoelectric substrate 2 may include a piezoelectric single crystalline film stacked on a supporting substrate. In addition, piezoelectric ceramic may be included instead of piezoelectric single crystal. An antenna terminal 3, a receiving terminal 4 defining and functioning as a signal terminal, and ground terminals 5 to 8 electrically connected to the ground potential are provided on the piezoelectric substrate 2.

Figure 3:
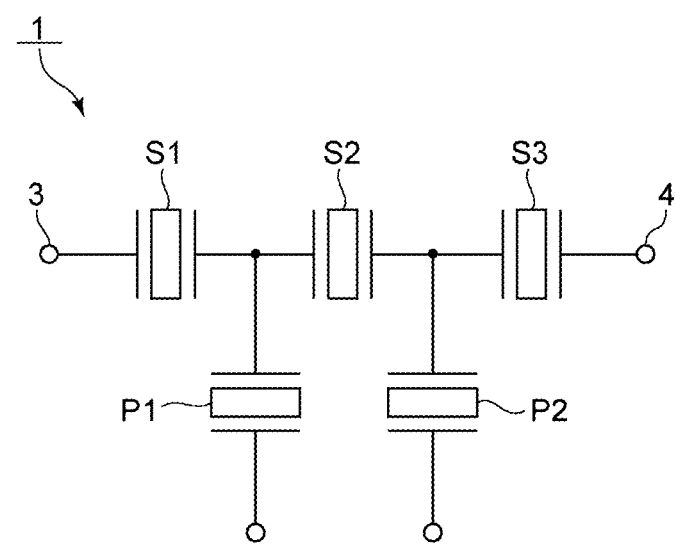
FIG. 3 is a circuit diagram of the acoustic wave device according to the first preferred embodiment of the present invention.

FIG. 3 is a circuit diagram of the acoustic wave device 1. In the acoustic wave device 1, a plurality of series arm resonators S1, S2, and S3 are electrically connected in series with each other on a series arm that electrically connects the antenna terminal 3 to the receiving terminal 4. In addition, a parallel arm resonator P1 is electrically connected between a connecting point between the series arm resonators S1 and S2 and the ground potential. A parallel arm resonator P2 is electrically connected between a connecting point between the series arm resonators S2 and S3 and the ground potential. That is, the acoustic wave device 1 is preferably a ladder filter including the series arm resonators S1 to S3 and the parallel arm resonators P1 and P2 as a plurality of resonators.

Electrode materials for the antenna terminal 3, the receiving terminal 4, the ground terminals 5 to 8, the series arm resonators S1 to S3, and the parallel arm resonators P1 and P2 are not specifically limited. For example, a metal such as Cu, Al, Pt, Au, Mo, or W or an alloy mainly containing any of these metals may preferably be used. In addition, a laminated metal film in which a plurality of metal films are laminated may also be used.

Note that the acoustic wave device 1 is preferably used as, for example, a receiving filter for a smartphone, a cellular phone, or the like. In the present preferred embodiment, the acoustic wave device 1 is a Band 5 receiving filter.

As illustrated in FIGS. 1 and 3, the series arm resonator S1 is the closest to the antenna terminal 3 among the plurality of series arm resonators S1 to S3. In addition, the resonator closest to the antenna terminal 3 among the plurality of resonators is also the series arm resonator S1.

Figure 2:
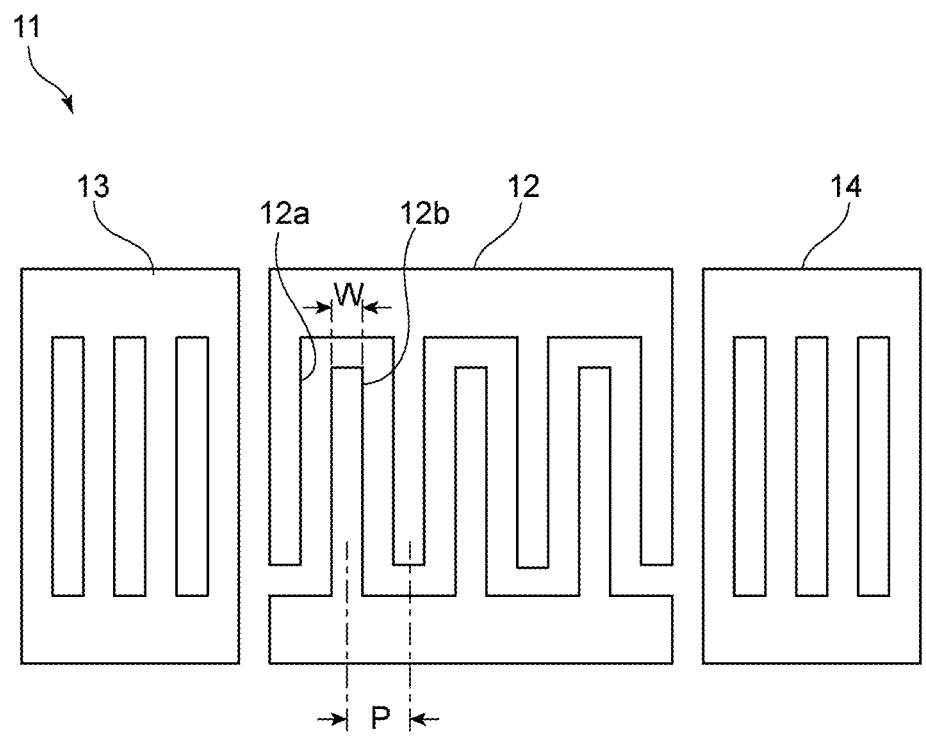
FIG. 2 is a plan view illustrating an electrode of a one-port acoustic wave resonator in the first preferred embodiment of the present invention.

The series arm resonator S1 is preferably, for example, a one-port acoustic wave resonator. FIG. 2 is a plan view illustrating an electrode of a one-port acoustic wave resonator. In an acoustic wave resonator 11, reflectors 13 and 14 are provided on both sides of an IDT electrode 12 in an acoustic-wave propagation direction. The IDT electrode 12 includes a plurality of first electrode fingers 12a and a plurality of second electrode fingers 12b, which are interdigitated with each other. In the acoustic wave resonator 11, an electrode-finger center-center distance between one first electrode finger 12a and the adjacent second electrode finger 12b is an electrode-finger pitch P. A width-direction size of each of the first and second electrode fingers 12a and 12b is referred to as a width W. In this case, the width-direction size is a size along an acoustic-wave propagation direction of the first and second electrode fingers 12a and 12b. A duty of the IDT electrode 12 is expressed as W/P. That is, the duty is a metallization ratio.

Figure 4:
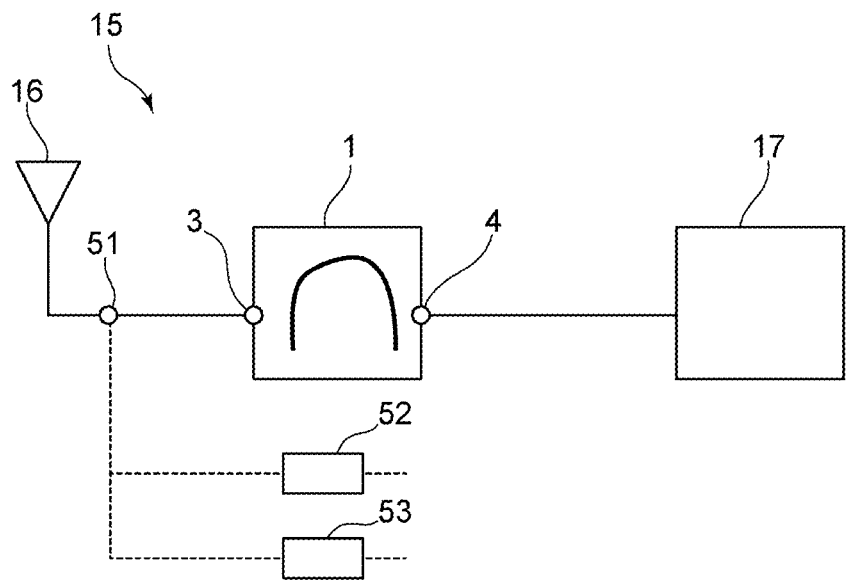
FIG. 4 is a circuit diagram of a filter device that includes the acoustic wave device according to the first preferred embodiment of the present invention.

FIG. 4 is a circuit diagram of a filter device that include the acoustic wave device 1. In a filter device 15, the antenna terminal 3 of the acoustic wave device 1 is electrically connected to an antenna 16. An amplifier 17 is electrically connected downstream from the receiving terminal 4.

A preferred feature of the acoustic wave device 1 is that the duty of the IDT electrode of the series arm resonator S1, which is the closest to the antenna terminal 3 among the plurality of series arm resonators S1 to S3, is smaller than the duty of the IDT electrode of at least one of the other series arm resonators S2 and S3. As a result, the occurrence of IMD is able to be significantly reduced or prevented and miniaturization is able to be achieved. This will be more specifically described with reference to FIG. 5.

Figure 5:
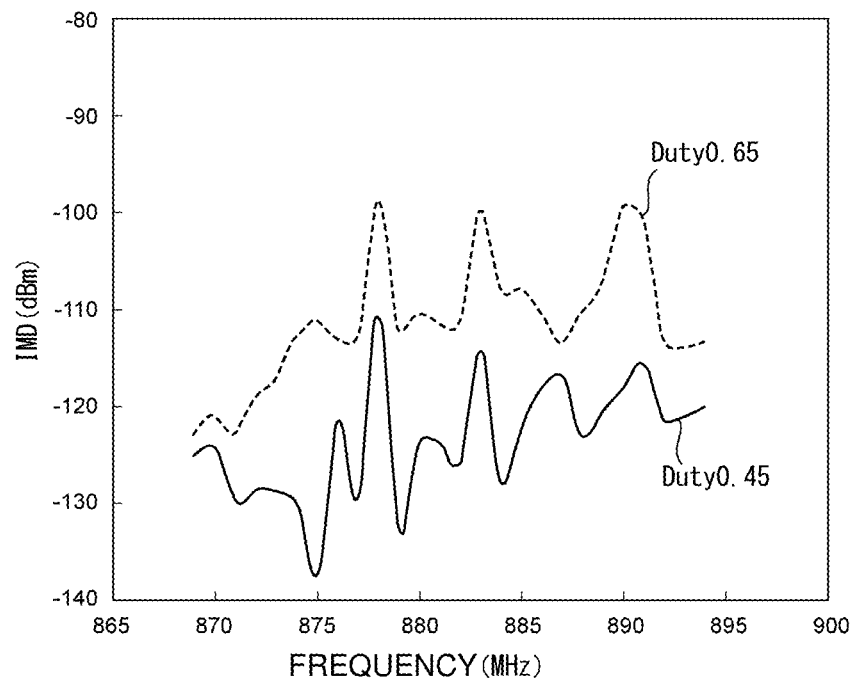
FIG. 5 is a diagram illustrating IMD characteristics of a series arm resonator S1 and a comparative example of an acoustic wave resonator.

FIG. 5 is a diagram illustrating IMD characteristics of the series arm resonator S1 and IMD characteristics of a comparative example of an acoustic wave resonator. In FIG. 5, a solid line indicates the IMD characteristics of the series arm resonator S1, and a broken line indicates the IMD characteristics of the comparative example of an acoustic wave resonator.

Note that design parameters of the series arm resonator S1 are as follows.

The duty of the IDT electrode=about 0.45, the number of pairs of electrode fingers=80, and an electrode-finger overlap width=about 100.1 (μm). The wavelength determined by the electrode-finger pitch P is λ=about 4.325 (μm).

The number of electrode fingers of the reflectors=20.

Design parameters of the comparative example of an acoustic wave resonator are the same or substantially the same as those of the series arm resonator S1, except that the duty of the IDT electrode is set to about 0.65.

As is clear from FIG. 5, regarding IMD characteristics for the 2Tx-Rx band of Band 5, the series arm resonator S1 is improved in terms of IMD characteristics over the comparative example of the acoustic wave resonator. The inventor of preferred embodiments of the present application experimentally discovered that IMD characteristics are able to be improved if the duty of the IDT electrode of a series arm resonator arranged on the series arm is reduced. The resonator that most greatly affects IMD is a resonator close to the antenna terminal 3.

Thus, in the acoustic wave device 1, the duty of the IDT electrode of the series arm resonator S1, which is the closest to the antenna terminal 3 among the plurality of series arm resonators, is set to be small. That is, the duty of the IDT electrode of the series arm resonator S1 is set to be smaller than the duty of the IDT electrode of at least one of the series arm resonators S2 and S3 among the other series arm resonators. Consequently, the IMD characteristics are able to be effectively improved.

In Japanese Unexamined Patent Application Publication No. 2012-147175 described above, an attempt is made to reduce IMD by electrically connecting the capacitor in parallel with the parallel arm resonator. In contrast to this, in the acoustic wave device 1, there is no need to connect an additional capacitor in order to reduce IMD. Consequently, further miniaturization is able to be achieved and the manufacturing process thereof is able to be simplified.

Note that, it is preferable that the duty of the IDT electrode of the series arm resonator S1, which is the closest to the antenna terminal 3, is the smallest among the duties of the IDT electrodes of the plurality of series arm resonators S1 to S3. As a result, the occurrence of IMD is able to be further significantly reduced or prevented.

In the duplexer described in Japanese Unexamined Patent Application Publication No. 2012-147175, the resonant frequency is increased by electrically connecting the capacitor in parallel with the parallel arm resonator. Thus, regarding filter characteristics, a lower-band side attenuation pole is closer to a pass band, thus increasing steepness.

It is preferable that the resonant frequency of the series arm resonator S1, which is the closest to the antenna terminal 3, is not set to be the lowest. That is, the resonant frequency of at least one of the series arm resonators S2 and S3 is preferably set to be lower than that of the series arm resonator S1. This is because, as the duty of the series arm resonator S1, which is the closest to the antenna terminal 3, decreases, the resonant frequency increases and the impedance at the resonant frequency increases. Thus, the impedance characteristics at the resonant frequency are degraded. Thus, if the resonant frequency of the series arm resonator S1 is positioned inside the pass band, the insertion loss may be increased. In the present preferred embodiment, since the resonant frequency of the series arm resonator S1, which is the closest to the antenna terminal 3, is not set to be the lowest, an increase in insertion loss in the pass band is able to be significantly reduced or prevented. More preferably, the other series arm resonators S2 and S3 include a series arm resonator whose resonant frequency is lower than that of the series arm resonator S1. Consequently, the steepness is able to be maintained and an increase in insertion loss is able to be significantly reduced or prevented.

It is preferable that the resonant frequency of the series arm resonator S1 is outside the pass band. Consequently, an increase in insertion loss is able to be further significantly reduced or prevented. Note that the resonant frequency of the series arm resonator S1 may be positioned inside the pass band.

In addition, the duty of the IDT electrode of the series arm resonator S1 does not need to be the smallest among the duties of the IDT electrodes of the plurality of series arm resonators S1 to S3. Note that, it is preferable that the duty of the IDT electrode of the series arm resonator S1 is the smallest as described above.

Among the plurality of series arm resonators S1 to S3, the duty of the IDT electrode of a series arm resonator whose size along the acoustic-wave propagation direction is preferably greater than the duty of the IDT electrode of a series arm resonator whose size along the acoustic-wave propagation direction is relatively small. For example, in the present preferred embodiment, as illustrated in FIG. 1, the size of the series arm resonator S3 along the acoustic-wave propagation direction is greater than the size of the series arm resonator S2 along the acoustic-wave propagation direction. In this case, it is preferable that the duty of the IDT electrode of the series arm resonator S3 is greater than the duty of the IDT electrode of the series arm resonator S2. Consequently, further miniaturization is able to be achieved. This is based on the following reasons. As the duty decreases, a metallized portion becomes smaller. In the metallized portion, the acoustic velocity slows down. Thus, as the duty decreases, the metallized portion becomes smaller, thus increasing the acoustic velocity. As the acoustic velocity increases (in a case where the electrode-finger pitch is constant or substantially constant), the resonant frequency or anti-resonant frequency increases. Thus, the electrode-finger pitch needs to be increased in order to keep the resonant frequency or anti-resonant frequency constant or substantially constant. As a result, this may result in an increase in the size of the acoustic wave resonator in the acoustic-wave propagation direction.

Thus, as described above, further miniaturization is able to be achieved by increasing the duty of the IDT electrode of the series arm resonator S3 with a relatively large size along the acoustic-wave propagation direction.

In addition, it is preferable that the duty of the IDT electrode of the series arm resonator S3 whose size along the acoustic-wave propagation direction is the largest among the plurality of series arm resonators S1 to S3 is the largest among the duties of the IDT electrodes of the series arm resonators S1 to S3 and parallel arm resonators P1 and P2. Consequently, acoustic wave devices are able to be further reduced in size.

Figure 6:
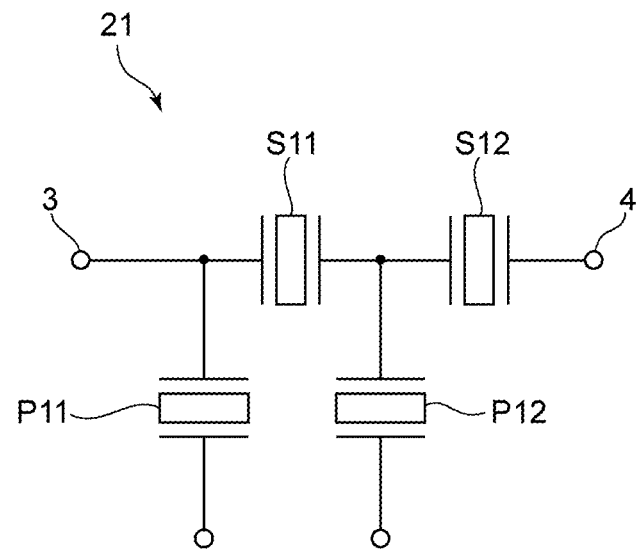
FIG. 6 is a circuit diagram of an acoustic wave device according to a second preferred embodiment of the present invention.

FIG. 6 is a circuit diagram of an acoustic wave device according to a second preferred embodiment of the present invention. In an acoustic wave device 21, series arm resonators S11 and S12 are provided on the series arm that electrically connects the antenna terminal 3 to the receiving terminal 4 defining and functioning as a signal terminal. A parallel arm resonator P11 is electrically connected between the antenna terminal 3 and the ground potential. A parallel arm resonator P12 is electrically connected between a connecting point between the series arm resonators S11 and S12 and the ground potential. Among the series arm resonators S11 and S12 and the parallel arm resonators P11 and P12 defining and functioning as a plurality of resonators, the resonator closest to the antenna terminal 3 is the parallel arm resonator P11. Accordingly, not the series arm resonator S11 but the parallel arm resonator P11 may be the resonator closest to the antenna terminal 3.

In this case, also, it is sufficient that the duty of the series arm resonator S11, which is closer to the antenna terminal 3 among the plurality of series arm resonators S11 and S12, is smaller than the duty of the IDT electrode of the other series arm resonator S12. Note that, as illustrated in FIG. 6, the number of series arm resonators other than the series arm resonator S11, which is the closest to the antenna terminal, may be one.

Figure 7:
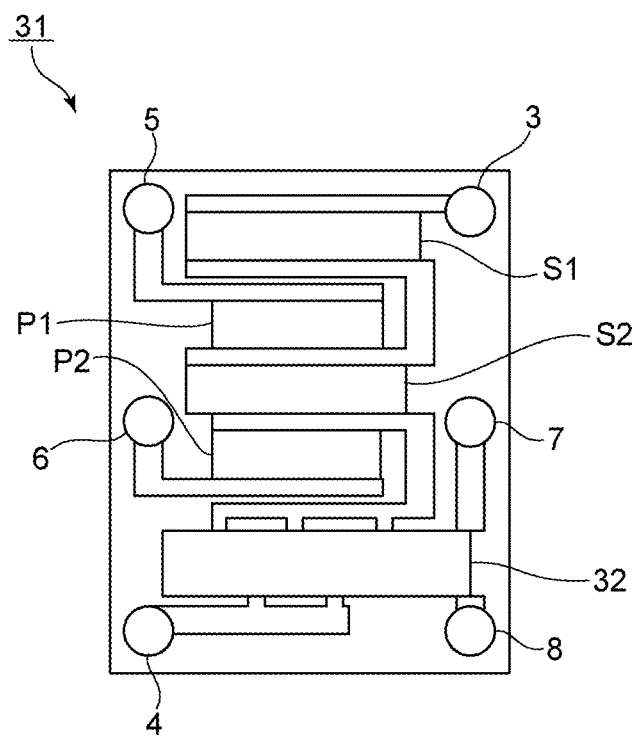
FIG. 7 is a plan view of an electrode of an acoustic wave device according to a third preferred embodiment of the present invention.
Figure 8:
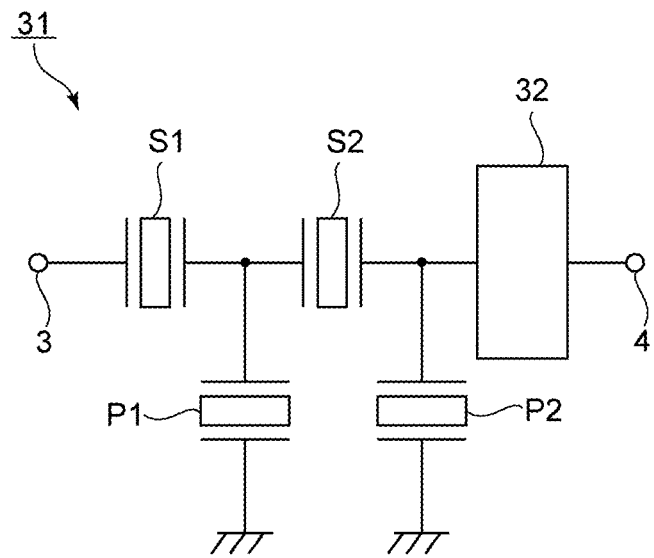
FIG. 8 is a circuit diagram of the acoustic wave device according to the third preferred embodiment of the present invention.

FIG. 7 is a plan view of an electrode of an acoustic wave device according to a third preferred embodiment, and FIG. 8 is a circuit diagram of the acoustic wave device according to the third preferred embodiment.

In an acoustic wave device 31 according to the third preferred embodiment, a 5-IDT longitudinally coupled resonator acoustic wave filter 32, for example, is preferably provided instead of the series arm resonator S3 in the first preferred embodiment. That is, the plurality of series arm resonators S1 and S2 and the longitudinally coupled resonator acoustic wave filter 32 are electrically connected in series with each other on the series arm electrically connecting the antenna terminal 3 to the receiving terminal 4 defining and functioning as a signal terminal. In the present preferred embodiment, the acoustic wave device 31 includes, as a plurality of resonators, the longitudinally coupled resonator acoustic wave filter 32 in addition to the series arm resonators S1 and S2 and the parallel arm resonators P1 and P2. Accordingly, a longitudinally coupled resonator acoustic wave filter may be provided on the series arm.

In this case, the resonators on the series arm are the series arm resonators S1 and S2 and the longitudinally coupled resonator acoustic wave filter 32.

In the third preferred embodiment, also, it is sufficient that the duty of the IDT electrode of the series arm resonator S1, which is closer to the antenna terminal 3 among the series arm resonators S1 and S2, is smaller than the duty of the IDT electrode of the other series arm resonator S2. As a result, similarly to the first preferred embodiment, the occurrence of IMD is also able to be significantly reduced or prevented in the third preferred embodiment. In addition, no capacitor needs to be electrically connected in parallel, and thus the acoustic wave device 31 is able to also be reduced in size.

Figure 9:
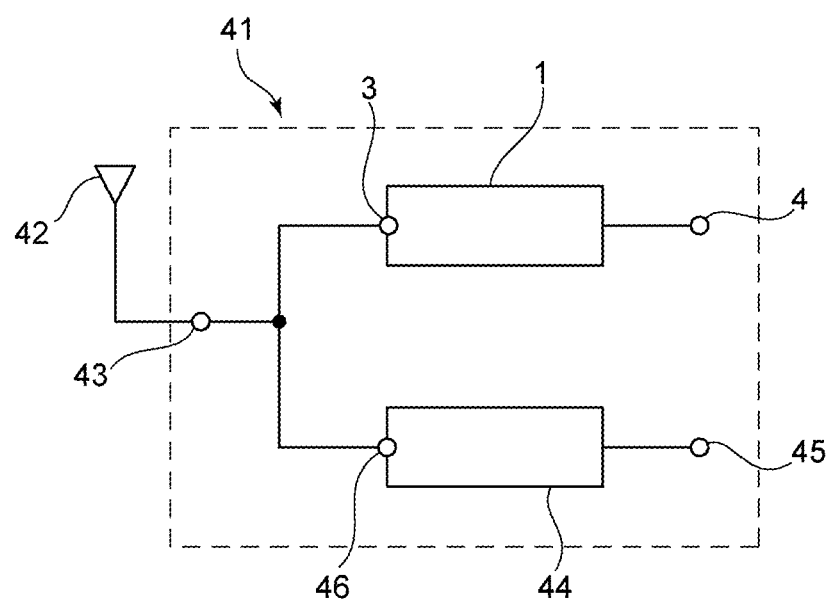
FIG. 9 is a circuit diagram of a duplexer defining and functioning as a fourth preferred embodiment of the present invention.

FIG. 9 is a circuit diagram of a duplexer according to a fourth preferred embodiment of the present invention. A duplexer 41 includes a common terminal 43, which is electrically connected to an antenna 42. The acoustic wave device 1 according to the first preferred embodiment is electrically connected as a first band-pass filter to the common terminal 43. That is, the antenna terminal 3 is electrically connected to the common terminal 43. In addition, a second band-pass filter 44 is also electrically connected to the common terminal 43. The second band-pass filter 44 is a transmitting filter that includes a transmission terminal and an output terminal 46. The output terminal 46 is electrically connected to the common terminal 43. Accordingly, the duplexer 41 includes a receiving filter, which is the first band-pass filter of the acoustic wave device 1, and a transmitting filter, which is the second band-pass filter 44.

In addition, as indicated by a broken line in FIG. 4, not only the acoustic wave device 1 defining and functioning as the first band-pass filter but also two or more band-pass filters 52 and 53 with different pass bands may be electrically connected to a common terminal 51 to define a common connection. In that case, a bundled filter device suitable for carrier aggregation (CA) is able to be provided. Note that, in a case where the filter device is used for CA or the like, it is sufficient that the acoustic wave device 1 and at least one band-pass filter with a different pass band are electrically connected to the common terminal 51 to define a common connection.

Note that preferred embodiments describing receiving filters have been described in the first to third preferred embodiments. However, the acoustic wave devices according to preferred embodiments of the present invention may also be applied to transmitting filters. That is, even in a transmitting filter, the resonator that most greatly affects IMD characteristics is the resonator closest to an antenna terminal. Thus, the preferred embodiments of the present invention are able to also be applied to a transmitting filter with a plurality of series arm resonators on a series arm.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a piezoelectric substrate;
   an antenna terminal provided on the piezoelectric substrate and electrically connected to an antenna;
   a signal terminal provided on the piezoelectric substrate, to which a signal is input, and from which a signal is output; and
   a plurality of resonators provided on the piezoelectric substrate and including an IDT electrode; wherein
   the plurality of resonators include a plurality of series arm resonators on a series arm electrically connecting the antenna terminal to the signal terminal; and
   a duty of the IDT electrode of a series arm resonator closest to the antenna terminal among the plurality of series arm resonators is smaller than a duty of the IDT electrode of at least one other series arm resonator among the plurality of series arm resonators.

2. The acoustic wave device according to claim 1, wherein the duty of the IDT electrode of the series arm resonator closest to the antenna terminal is a smallest duty among the duties of the IDT electrodes of the plurality of series arm resonators.

3. The acoustic wave device according to claim 1, wherein other series arm resonators among the plurality of series arm resonators include a series arm resonator with a lower resonant frequency than the series arm resonator closest to the antenna terminal.

4. The acoustic wave device according to claim 1, wherein, among the plurality of series arm resonators, the duty of the IDT electrode of a series arm resonator whose size along an acoustic-wave propagation direction is relatively large is greater than the duty of the IDT electrode of a series arm resonator whose size along the acoustic-wave propagation direction is relatively small.

5. The acoustic wave device according to claim 1, wherein the IDT electrode of a series arm resonator whose size along an acoustic-wave propagation direction is the largest, from among the plurality of series arm resonators, has a duty that is the largest among the duties of the IDT electrodes of all the resonators.

6. The acoustic wave device according to claim 1, wherein a resonator closest to the antenna terminal among the plurality of resonators is the series arm resonator closest to the antenna terminal.

7. The acoustic wave device according to claim 1, wherein the plurality of resonators include the plurality of series arm resonators and a plurality of parallel arm resonators electrically connected between the series arm and the ground potential, and a ladder filter is provided.

8. The acoustic wave device according to claim 1, wherein the plurality of resonators include the plurality of series arm resonators and a longitudinally coupled resonator acoustic wave filter provided on the series arm.

9. The acoustic wave device according to claim 1, wherein the signal terminal is a receiving terminal and a receiving filter.

10. A duplexer comprising:
a first band-pass filter; and
a second band-pass filter, which is electrically connected to the first band-pass filter and an antenna terminal to define a common connection; wherein
at least one of the first band-pass filter and the second band-pass filter includes the acoustic wave device according to claim 1.

11. A filter device comprising:
a first band-pass filter including the acoustic wave device according to claim 1; and
at least one second band-pass filter that is electrically connected to the antenna terminal to define a common connection.

12. The acoustic wave device according to claim 1, wherein the piezoelectric substrate is a piezoelectric ceramic or a piezoelectric single crystalline film stacked on a supporting substrate.

13. The acoustic wave device according to claim 1, wherein the plurality of series arm resonators includes at least three series arm resonators.

14. The filter device according to claim 11, wherein a resonant frequency of at least one of the plurality of series arm resonators is outside of a pass band of the first band-pass filter.

15. The filter device according to claim 11, wherein the first band-pass filter and the at least one second band-pass filter have different pass bands from one another.

16. The filter device according to claim 11, wherein the at least one second band-pass filter includes at least two band-pass filters.

17. The duplexer according to claim 10, wherein the first band-pass filter is a receiving filter and the second band-pass filter is a transmitting filter.

* * * * *